United States Patent [19]
Ferchau et al.

[11] Patent Number: 5,311,408
[45] Date of Patent: May 10, 1994

[54] ELECTRONIC ASSEMBLY WITH IMPROVED GROUNDING AND EMI SHIELDING

[75] Inventors: Joerg U. Ferchau; Kenneth A. Kotyuk, both of Morgan Hill; Randall J. Diaz, Gilroy, all of Calif.

[73] Assignee: Tandem Computers, Incorporated, Cupertino, Calif.

[21] Appl. No.: 55,405

[22] Filed: Apr. 29, 1993

Related U.S. Application Data

[63] Continuation of Ser. No. 742,994, Aug. 9, 1991, abandoned.

[51] Int. Cl.$^5$ .............................................. H05K 9/00
[52] U.S. Cl. .................................. 361/818; 174/35 R; 174/35 C; 174/51; 361/728; 361/752; 361/753; 361/799; 361/800; 361/816; 439/108; 439/109; 439/609
[58] Field of Search .............. 174/35 R, 35 GC, 35 C, 174/51; 211/41; 361/334, 390, 392, 393, 394, 399, 412, 413, 415, 424, 427, 679, 724, 725, 728, 752, 753, 788, 796, 797, 799, 800, 816, 818; 439/61, 108, 109, 608, 609; 379/221-227

[56] References Cited

U.S. PATENT DOCUMENTS

| | | | |
|---|---|---|---|
| 1,765,443 | 6/1930 | Peterson | 174/35 R |
| 2,133,789 | 10/1938 | Pool | 174/35 GC |
| 4,260,849 | 4/1981 | Kirby | 174/35 GC |
| 4,579,406 | 4/1986 | Laursen et al. | 361/415 |
| 4,631,641 | 12/1986 | Brombal et al. | 361/424 |
| 4,761,516 | 8/1988 | Reichert | 174/35 GC |
| 4,791,524 | 12/1988 | Teigen et al. | 361/427 |
| 4,821,145 | 4/1989 | Corfits et al. | 361/415 |
| 4,823,235 | 4/1989 | Suzuki et al. | 361/424 |
| 4,889,959 | 12/1989 | Taylor et al. | 174/35 GC |
| 4,900,948 | 2/1990 | Hamilton | 361/415 |
| 4,903,170 | 2/1990 | Finney et al. | 361/415 |
| 4,918,575 | 4/1990 | Assel et al. | 361/424 |
| 4,970,625 | 11/1990 | Belanger et al. | 361/424 |
| 5,001,297 | 3/1991 | Peregrim et al. | 174/35 GC |
| 5,023,754 | 6/1991 | Aug et al. | 361/424 |
| 5,070,430 | 12/1991 | Meussel et al. | 361/415 |
| 5,159,534 | 10/1992 | Hudson et al. | 361/415 |

FOREIGN PATENT DOCUMENTS

| | | | |
|---|---|---|---|
| 1186388 | 4/1985 | Canada | 439/61 |
| 0207226 | 1/1987 | European Pat. Off. | 361/424 |
| 1591387 | 11/1969 | Fed. Rep. of Germany | 174/35 GC |
| 3211758 | 10/1983 | Fed. Rep. of Germany | 361/424 |
| 3335050 | 4/1985 | Fed. Rep. of Germany | 361/424 |
| 0250405 | 6/1986 | Fed. Rep. of Germany | 174/51 |
| 0647442 | 12/1950 | United Kingdom | 174/35 GC |

OTHER PUBLICATIONS

IBM Disclosure Bulletin "Method for Providing EMC Protection to a Backplane with Exposed Edges" vol. 33 No. 6A Nov. 1990.
IBM Disclosure Bulletin "Electromagnetic Shielded Connector" by Bunch and Kantner vol. 15 No. 1 Jun. 1972.
Scanbe Manufacturing Corp. (Brochure) "The Most Sophisticated Housing Developments", Sep. 22, 1969.
RCA Technical Notes "Radio Interference Gaskets" RCA TN No. 189 Aug. 18, 1958.

*Primary Examiner*—Leo P. Picard
*Assistant Examiner*—Donald A. Sparks
*Attorney, Agent, or Firm*—Townsend & Townsend Khourie & Crew

[57] ABSTRACT

An electronic assembly includes an electronic module mountable to a backplane having a ground plane for grounding and EMI shielding. The electronic module includes a conductive chassis having a floating chassis board. Interface connectors are mounted to the chassis board and to the backplane and mate with one another when the electronic module engages the backplane. A grounding clip is mounted to the chassis board and is used to engage an alignment pin extending from the backplane. The grounding clip includes a laterally extending resilient arm which grounds the clip to the chassis. The alignment pin is electrically connected to the backplane ground plane and the grounding clip is electrically connected to the chassis board ground plane so that both ground planes are grounded to the chassis through the grounding clip. The backplane includes a ground pad which circumscribes the interface connectors and is connected to the ground plane. A conductive gasket mechanically and electrically couples the chassis with the ground pad so that the chassis, conductive gasket, ground pad and ground plane provide an effective EMI shield surrounding the interface connectors.

6 Claims, 2 Drawing Sheets

ELECTRONIC ASSEMBLY WITH IMPROVED GROUNDING AND EMI SHIELDING

This si a continuation of application Ser. No. 07/742,994, filed Aug. 9, 1991, now abandoned.

BACKGROUND OF THE INVENTION

Shielding electronic components from electromagnetic interference (EMI) is important in many applications. Many electronic modules include an electrically conductive chassis which, when grounded,. acts an effective EMI shield. However, many electronic modules are mounted to common backplanes within an electronic assembly. See, for example, U.S. Pat. No. 4,899,254 entitled "Electronic Module Interconnection System", the disclosure of which is incorporated by reference, which discloses a backplane printed circuit board used in an electronic system having a number of electronic modules. One of the problems associated with this type of electronic assembly is that EMI can be created but not effectively shielded at the interface between the electronic modules and the backplane to which they are connected.

SUMMARY OF THE INVENTION

The present invention is directed to an electronic assembly which provides improved grounding and improved EMI shielding at the interface of an electronic module with a backplane. The invention is particularly suited to applications where a common potential between grounds is necessary.

The backplane includes a ground plane to act as a ground and to provide for EMI shielding. The electronic module includes a conductive chassis within which a chassis board is mounted. Interface connectors are mounted to the chassis board and to the backplane and mate with one another when the electronic module is in an engaged position relative to the backplane. The backplane includes a ground pad, electrically connected to the ground plane, which at least substantially circumscribes the interface connectors. A conductive gasket or like device mechanically and electrically couples the chassis with the ground pad along the length of the ground pad; the chassis, conductive gasket, ground pad and ground plane thus provide an EMI shield surrounding the interface connectors.

The chassis board is preferably of a floating type to aid proper registration and engagement of the interface connectors and to remove module weight from the connectors. A grounding clip can be used to engage an alignment pin extending from the backplane. The grounding clip includes a resilient arm extending at an acute angle to the alignment pin. The arm is sized and configured to engage the chassis regardless of the position of the floating chassis board. The alignment pin is electrically connected to the chassis through the grounding clip. The alignment pin is preferably electrically connected to the ground plane of the backplane and the grounding clip is preferably electrically connected to the ground plane of the chassis board as well.

By appropriately sizing the alignment pin, the present invention permits the alignment pin to engage the grounding clip prior to any other electrical connections between the electronic module and the backplane for a first-to-make, last-to-break ground, which aids dissipation of electrostatic discharge. This allows the chassis and ground plane of the backplane to be grounded at the time of the electrical connection between the interface connectors.

The conductive gasket also acts as an air barrier or seal between the chassis of the electronic module and the backplane. This is quite useful when an air path is to be provided through one or more openings in the backplane for proper cooling air flow through the electronic module. In addition to providing EMI shielding, use of such a conductive gasket can provide for noise/vibration abatement and for better air flow management between the chassis and the backplane by reducing air leakage between the chassis and the backplane to help insure the air flow is along the desired paths.

Other features and advantages of the invention will appear from the following description in which the preferred embodiment has been set forth in detail in conjunction with the accompanying drawings.

DESCRIPTION OF THE PREFERRED EMBODIMENT

Figure 1:
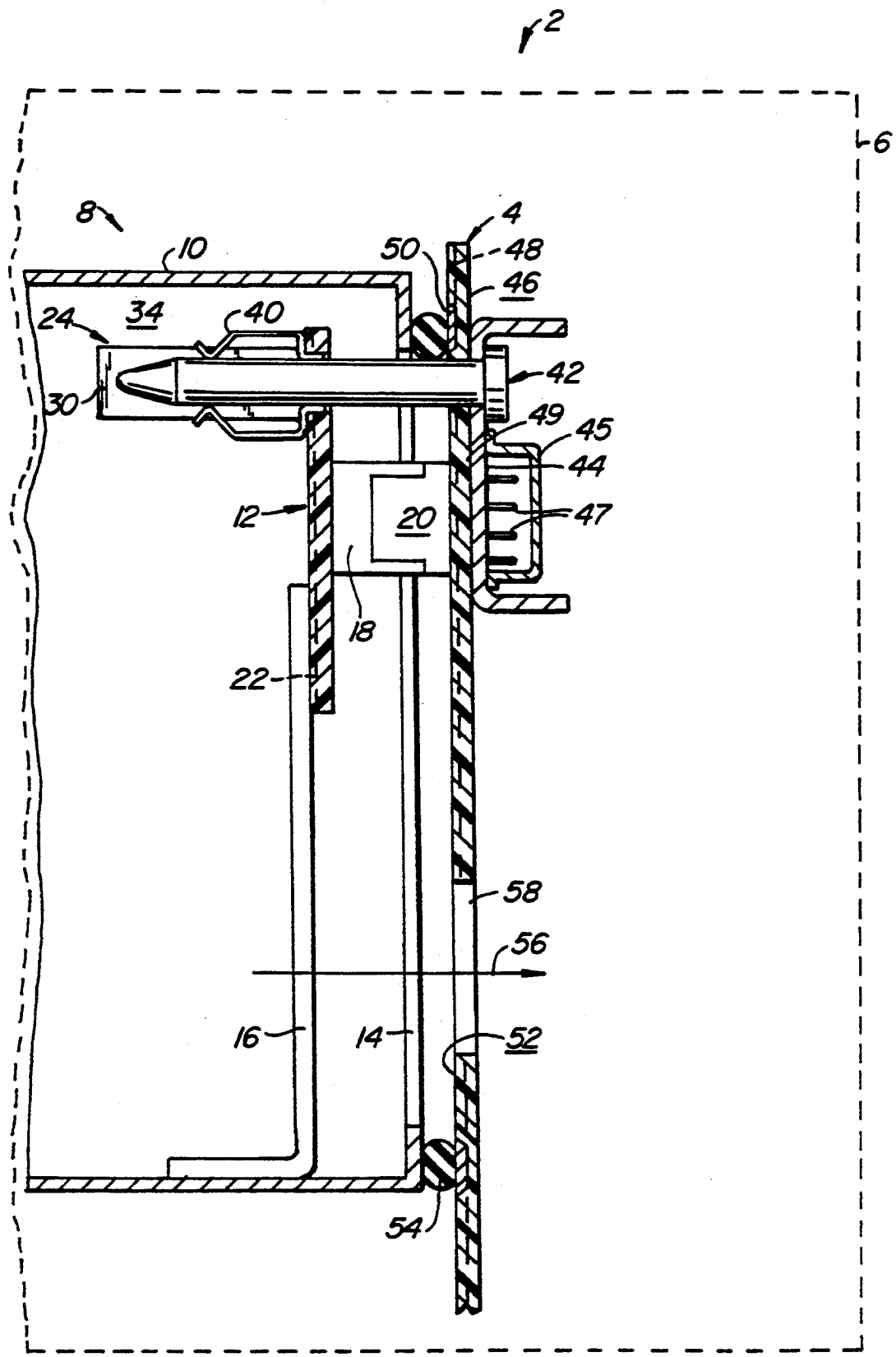
FIG. 1 is a simplified cross-sectional view of an electronic assembly with improved EMI shielding and grounding made according to the invention.

FIG. 1 illustrates, in simplified form, an electronic assembly 2 including a backplane 4 mounted within a housing 6 and an electronic module 8 shown at its engaged position relative to backplane 4.

Electronic module 8 includes a conductive chassis 10, typically made of metal or conductive plastic, such as conductive ABS, housing a floating chassis board 12 at an open end 14 of chassis 10 by a chassis board mount 16. Chassis board 12 is mounted to chassis board mount 16 so that chassis board 12 can move or float in an x-y plane extending perpendicular to the plane of FIG. 1 and vertically with reference to FIG. 1. A chassis board interface connector 18 and a backplane interface connector 20 are mounted to board 12 and backplane 4, respectively. By making board 12 a floating board, exact alignment is not needed between interface connectors 18, 20 to achieve proper engagement of the connectors as shown in FIG. 1. The floating mounting of board 12 to mount 16 is conventional and will therefore not be described in detail.

Figure 2:
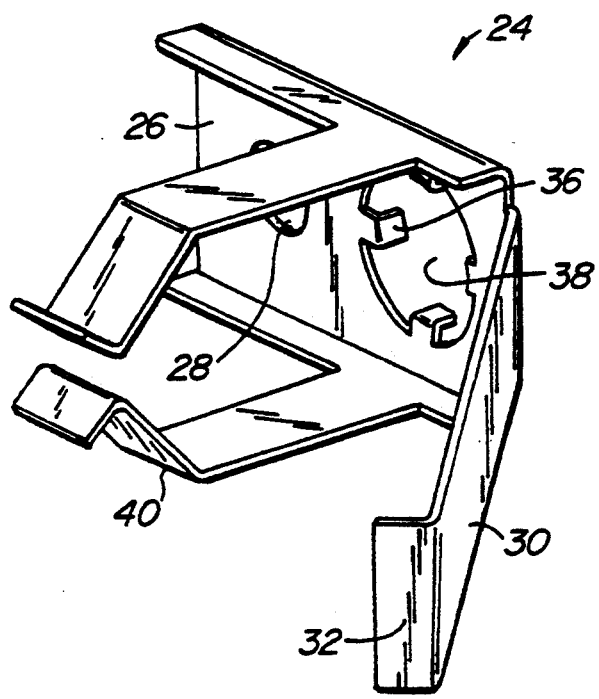
FIG. 2 is an overall view of the grounding clip of FIG. 1.
Figure 3:
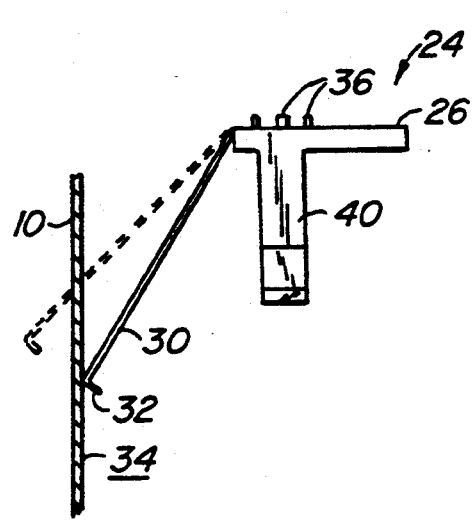
FIG. 3 is a simplified top view illustrating the engagement of the grounding clip of FIG. 1 with the chassis of FIG. 1.
Figure 4:
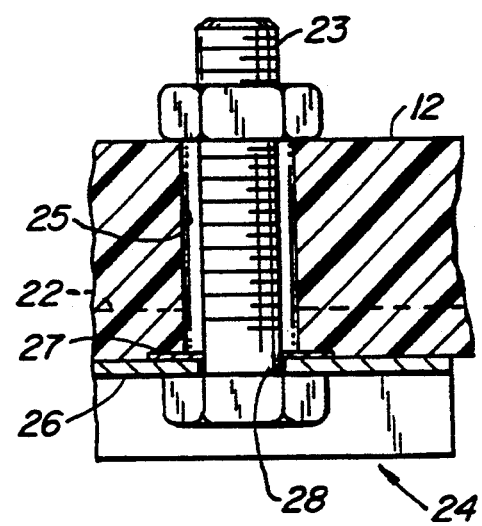
FIG. 4 is an enlarged top cross-sectional view showing the mounting of the grounding clip to the chassis board of FIG. 1.

Board 12 includes a chassis board ground plane 22 which acts as ground for any of the various components mounted to board 12. To ground board 12 to chassis 10, a grounding clip 24, see FIGS. 2, 3 and 4, is mounted to board 12. Grounding clip 24 includes a base 26 having a hole 28 by which clip 24 can be secured to board 12 using an appropriate fastener, such as a machine screw 23 or rivet, which passes through a hole 25 formed in board 12. Board 12 has a conductive annular ring 27 plated around hole 25 and in contact with base 26 of clip 24. Ring 27 is electrically connected to ground plane 22 so that clip 24 is grounded to ground plane 22. Grounding clip 24 further includes a laterally extending arm 30.

Arm 30 is sized and positioned so that the outer end 32 engages a sidewall 34 of chassis 10, see FIG. 3, so that a good ground is achieved between ground plane 22 and chassis 10 through clip 24. Clip 24 is designed to maintain a good ground between chassis 10 and chassis board 12 even when floating chassis board 12 must move to permit mating between connectors 18, 20.

Grounding clip 24 also includes a set of first pin contacts 36 extending into a hole 38 formed in base 26 and a pair of second pin contacts 40 extending away from base 26. Contacts 36, 40 are used to engage an alignment pin 42 extending from backplane 4. Alignment pin 42 is mounted to an alignment bracket 44, bracket 44 being secured to a side 46 of backplane 4 facing away from module 8. Alignment bracket 44 is used to provide suitable mechanical support to alignment pin mounted to backplane 4. Bracket 44 includes a connector pin field shield 45. Shield 45 covers pins 47, extending from connector 20 and passing through a hole (not shown) in bracket 44, for enhanced EMI shielding.

Backplane 4 includes a backplane ground plane 48 which provides both points of grounding for components mounted to backplane 4 and a degree of EMI shielding. Ground plane 48 is electrically connected to alignment pin 42 through a series of conductive pads 49, electrically connected to ground plane 48, located on side 46 of backplane 4 and situated to make good electrical contact with bracket 44. If bracket 44 is not used, conductive pads 49 can be positioned to engage the enlarged head 51 of pin 42. With electronic module 8 in the engaged position of FIG. 1, ground plane 48 is grounded to chassis 10 through conductive pads 49, bracket 44, alignment pin 42 and grounding clip 24. Accordingly, grounding clip 24 grounds both chassis board ground plane 22 and backplane ground plane 48 to chassis 10.

Figure 1A:
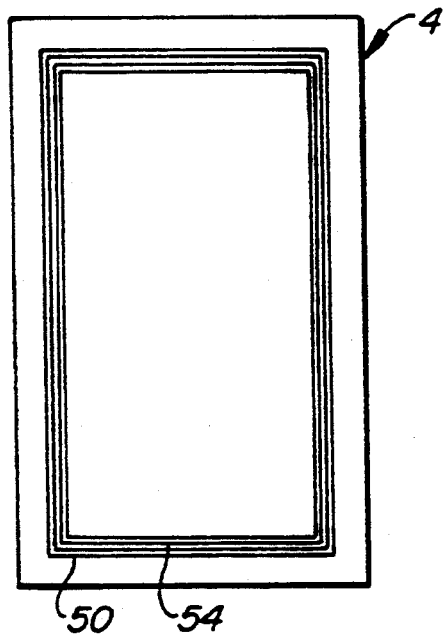
FIG. 1A is a simplified schematic plan view of the backplane, ground pad and gasket.

Backplane 4 also includes a continuous ground pad 50 electrically connected to ground plane 48 and exposed at side 52 of backplane 4 facing electronic module 8. Ground pad 50 is positioned to circumscribe or encircle interface connector 20 as shown in FIG. 1A. A conductive gasket 54, such as one made of nylon with metallic threads, silver filled silicon rubber or carbon loaded rubber, is mounted to chassis 10 using a contact adhesive. Gasket 54 is positioned to engage ground pad 50 when electronic module 8 is at the engaged position of FIG. 1. This provides EMI shielding at the interface of backplane 4 and module 8 and also a further ground path between ground plane 48 and chassis 10, in addition to the ground path provided through alignment pins 42. The basic plan view shape of conductive gasket 54 corresponds generally to the shape of ground pad 50. Alternatively, gasket 54 could be attached to backplane 4 using an adhesive or appropriate clips and grounded to a conductive surface on chassis 10.

Conductive gasket 54 also acts as an air seal between chassis 10 and backplane 4. This helps to better manage air flow, exemplified by arrow 56, from electronic module 8 and through an opening 58 in backplane 48. Commercially available copper finger stock may also be used as conductive gasket 54 when ducting of air and noise reduction is not required.

EMI shielding through opening 58 can be accomplished using a wire mesh (not shown), grounded to ground plane 48, covering opening 58. Alternatively, side-vented covers could be mounted on one or both sides 46, 52 of backplane 4 to provide a labyrinth type shield over opening 58.

When moving electronic module 8 from a disengaged position (not shown) to the engaged position of FIG. 1, the first contact made between electronic module 8 and backplane 4 is between alignment pin 42 and first pin contacts 36. Only after this grounding contact is made will electrical contact be made between interface connectors 18, 20. Second pin contacts 40 engage alignment pin 42 at the termination of the travel of electronic module 8 to the engaged position of FIG. 1. Contacts 40 are resilient and provide reliable grounding between clip 24 and pin 42.

Modification and variation can be made to the disclosed embodiment without departing from the subject of the invention as defined in the following claims. Instead of conductive gasket 54, other types of conductive couplings, such as elongate metal clips, could be used as well. Ground pad 50 need not be continuous but could be a series of ground pad segments.

What is claimed is:

1. An improved electronic assembly with EMI shielding of the type including a backplane, an electronic module including a chassis, and module and backplane interface connectors electrically coupling the electronic module and the backplane when the electronic module is at an engaged position relative to the backplane, the improvement comprising:

the backplane including a backplane ground plane and an exposed, elongated ground pad substantially circumscribing the interface connectors and facing the electronic module, the ground pad and the backplane ground plane electrically connected to one another, the elongated ground pad having a length;

conductive means for electrically coupling substantially the entire length of the elongated ground pad to the chassis so to create a coupled EMI shield including the chassis, the conductive coupling means, the ground pad and the backplane ground plane;

a conductive alignment pin extending form the backplane and electrically connected to the backplane ground plane;

a chassis board mounted within the chassis;

a grounding clip mounted to the chassis board for electrical engagement with the alignment pin when the electronic module is at the engaged position; and the grounding clip including a resilient arm extending laterally relative to the alignment pin and sized to engage the chassis to provide electrical connection from the alignment pin to the chassis.

2. The improved assembly of claim 1 wherein the module interface connector is mounted to the chassis board and wherein the chassis board is floatably mounted within the chassis to accommodate proper alignment of the module and backplane interface connectors, said resilient arm sized and configured to accommodate said floatable mounting of the chassis board while maintaining good electrical connection with the chassis.

3. The improved assembly of claim 2 wherein the chassis board includes a chassis board ground plane and wherein the grounding clip is electrically connected to the chassis board ground plane.

4. An electronic assembly comprising:

a first electronic component having a pin;

a second electronic component a coupled to the first electronic component, the second electronic component having a chassis and a hole through which the pin extends;

a grounding clip secured to the second electronic component comprising:

a base having an opening sized to accept the pin;

a pin contact extending from the base, the pin contact sized and positioned to contact the pin when the first and second components are coupled; and a resilient arm extending from the base in a direction at an acute angle to the pin, the arm sized and configured to engage the chassis thereby electrically connecting the grounding clip to the chassis.

5. The grounding clip of claim 4 wherein the pin contact includes:

a first pin contact extending inwardly into the opening; and a second pin contact extending generally parallel to the pin.

6. An electronic assembly with EMI shielding comprising:

a backplane;

an electronic module including a chassis;

module and backplane interface connectors electrically coupling the electronic module and the backplane when the electronic module is at an engaged position relative to the backplane;

the backplane including a backplane ground plane and an exposed, elongated ground pad substantially circumscribing the interface connectors and facing the electronic module, the ground pad and the backplane ground plane electrically connected to one another, the ground pad having a length;

conductive means for electrically coupling substantially the entire length of the elongated ground pad to the chassis so to crate an EMI shield including the chassis, the conductive coupling means, the ground pad and the backplane ground plane;

a conductive alignment pin extending from the backplane and electrically connected to the backplane ground plane;

a floatable chassis board floatably mounted within the chassis to accommodate proper alignment of the module and backplane interface connectors, the chassis board includes a chassis board ground plane;

module interface connector being mounted to the chassis board;

a grounding clip mounted to the chassis board for electrical engagement with the alignment pin when the electronic module is at the engaged position, the grounding clip being electrically connected to the chassis board ground plane;

the grounding clip including a resilient arm extending laterally relative to the alignment pin and sized to engage the chassis to provide electrical connection from the alignment pin to the chassis regardless of the position of the floatable chassis board.

* * * * *